United States Patent
Drayton (10) Patent No.: US 8,303,779 B2
(45) Date of Patent: Nov. 6, 2012

(54) METHODS FOR FORMING A TRANSPARENT CONDUCTIVE OXIDE LAYER ON A SUBSTRATE

(75) Inventor: Jennifer A. Drayton, Golden, CO (US)

(73) Assignee: PrimeStar Solar, Inc., Arvada, CO (US)

( * ) Notice: Subject to any disclaimer, the term of this patent is extended or adjusted under 35 U.S.C. 154(b) by 373 days.

(21) Appl. No.: 12/639,048

(22) Filed: Dec. 16, 2009

(65) Prior Publication Data

US 2011/0139246 A1    Jun. 16, 2011

(51) Int. Cl.
*C23C 14/00* (2006.01)
*C23C 14/32* (2006.01)

(52) U.S. Cl. .............. 204/192.29; 204/192.26

(58) Field of Classification Search ......... 204/192.29, 204/192.26
See application file for complete search history.

(56) References Cited

U.S. PATENT DOCUMENTS

| | | | |
|---|---|---|---|
| 3,654,110 A * | 4/1972 | Kraus | 204/192.12 |
| 3,811,953 A * | 5/1974 | Nozik | 136/256 |
| 3,887,451 A * | 6/1975 | Cuomo et al. | 204/192.13 |
| 5,393,675 A | 2/1995 | Compaan | |
| 5,738,767 A * | 4/1998 | Coad et al. | 204/192.12 |
| 5,873,983 A * | 2/1999 | Liu | 204/192.15 |
| 6,137,048 A | 10/2000 | Wu et al. | |
| 7,544,884 B2 | 6/2009 | Hollars | |
| 2002/0046945 A1 * | 4/2002 | Hosokawa et al. | 204/298.18 |
| 2004/0063320 A1 | 4/2004 | Hollars | |
| 2009/0145746 A1 | 6/2009 | Hollars | |
| 2009/0194165 A1 | 8/2009 | Murphy et al. | |

\* cited by examiner

*Primary Examiner* — Luan Van
*Assistant Examiner* — Ibrahime A Abraham
(74) *Attorney, Agent, or Firm* — Dority & Manning, P.A.

(57) ABSTRACT

Methods of depositing a transparent conductive oxide layer on a substrate are generally disclosed. A shield of greater than about 75% by weight molybdenum can be attached to a first surface of a substrate such that the shield contacts at least about 75% of the first surface. The shield can then be heated via an energy source to cause thermal exchange from the shield to the substrate to heat the substrate to a sputtering temperature. A transparent conductive oxide layer can then be sputtered on a second surface of the substrate at the sputtering temperature. Methods are also generally disclosed for manufacturing a cadmium telluride based thin film photovoltaic device.

18 Claims, 5 Drawing Sheets

METHODS FOR FORMING A TRANSPARENT CONDUCTIVE OXIDE LAYER ON A SUBSTRATE

FIELD OF THE INVENTION

The subject matter disclosed herein relates generally to methods of manufacturing cadmium telluride thin film photovoltaic devices. More particularly, the subject matter disclosed herein relates to methods of forming a transparent conductive oxide layer on a glass superstrate.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. For example, CdTe has an energy bandgap of about 1.45 eV, which enables it to convert more energy from the solar spectrum as compared to lower bandgap semiconductor materials historically used in solar cell applications (e.g., about 1.1 eV for silicon). Also, CdTe converts radiation energy in lower or diffuse light conditions as compared to the lower bandgap materials and, thus, has a longer effective conversion time over the course of a day or in cloudy conditions as compared to other conventional materials.

The junction of the n-type layer and the p-type layer is generally responsible for the generation of electric potential and electric current when the CdTe PV module is exposed to light energy, such as sunlight. Specifically, the cadmium telluride (CdTe) layer and the cadmium sulfide (CdS) form a p-n heterojunction, where the CdTe layer acts as a p-type layer (i.e., a positive, electron accepting layer) and the CdS layer acts as a n-type layer (i.e., a negative, electron donating layer). Free carrier pairs are created by light energy and then separated by the p-n heterojunction to produce an electrical current.

In order to collect the electrical current generated by the p-n heterojunction, a conductive layer is typically present between the window glass and the CdS layer, and a back contact layer is typically attached to the CdTe layer opposite of the CdS layer. The conductive layer and the back contact serve as negative and positive contacts, respectively, in the device. Typically, the conductive layer in CdTe-based devices includes cadmium stannate ($Cd_2SnO_4$) to form a transparent conducting oxide layer on the glass. Low sheet resistance and high transmission in the solar spectrum give cadmium stannate films the desired properties for a front (i.e., negative) contact.

The transparent conductive oxide ("TCO") layers including cadmium stannate are typically sputtered onto an unheated glass substrate resulting in an amorphous film, which is then annealed in an inert ambient at a pressure lower than atmosphere in the presence of CdS at a temperature above 600° C. for at least 20 minutes. After annealing, the film has a high transmission and low sheet resistance.

While this method is acceptable in a laboratory setting, such a high temperature anneal is difficult, if not prohibitive, in a manufacturing setting during commercial-scale production. For example, it is difficult to uniformly heat the glass superstrate to ensure that a uniform TCO layer is formed. The difficulty of uniformly heating the glass superstrate is amplified when large modules (e.g., having a surface area of greater than about 0.5 $m^2$) are being formed, which is common in a manufacturing setting during commercial-scale production.

Thus, a need exists for methods of forming a uniform TCO layer on a glass superstrate in order to efficiently manufacture cadmium telluride photovoltaic devices in commercial-scale production.

BRIEF DESCRIPTION OF THE INVENTION

Aspects and advantages of the invention will be set forth in part in the following description, or may be obvious from the description, or may be learned through practice of the invention.

Methods of depositing a transparent conductive oxide layer on a substrate are generally disclosed. According to one embodiment of the method, a shield of greater than about 75% by weight molybdenum can be attached to a first surface of a substrate such that the shield contacts at least about 75% of the first surface. The shield can then be heated via an energy source to cause thermal exchange from the shield to the substrate to heat the substrate to a sputtering temperature. A transparent conductive oxide layer can then be sputtered on a second surface of the substrate at the sputtering temperature.

Methods are also generally disclosed for manufacturing a cadmium telluride based thin film photovoltaic device. Accordingly, the method of depositing a transparent conductive oxide layer on a substrate can be continued by sputtering a resistive transparent buffer layer on the transparent conductive oxide layer, forming a cadmium sulfide layer on the resistive transparent buffer layer, forming a cadmium telluride layer on the cadmium sulfide layer; and forming a back contact layer on the cadmium telluride layer.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

Repeat use of reference characters in the present specification and drawings is intended to represent the same or analogous features or elements.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "μm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Generally speaking, methods for sputtering a transparent conductive oxide layer ("TCO layer") on a substrate are presently disclosed. Additionally, methods for sputtering subsequent layers on the TCO layer (e.g., a resistive transparent buffer layer, a cadmium sulfide layer, etc.) are presently disclosed. These methods are particularly useful during manufacturing cadmium telluride thin film photovoltaic devices.

The presently disclosed methods use a molybdenum shield attached to the substrate to ensure substantially uniform heating of the substrate prior to and during deposition (e.g., sputtering) of thin film layers on the exposed surface of the substrate. The substrate and molybdenum shield are positioned such that the molybdenum shield is between an energy source and the substrate. The energy source provides thermal energy to heat the molybdenum shield, which can then heat the substrate substantially uniformly via thermal exchange between the molybdenum shield and the substrate.

Generally, molybdenum has the sufficient thermal properties to ensure substantially uniform heating through thermal exchange between the molybdenum shield and the substrate. For example, molybdenum has an extremely high melting point (i.e., about 2623° C.) and burns only at temperatures above 600° C., allowing a molybdenum shield to be heated to extreme temperatures without fear of melting or otherwise damaging the shield. Additionally, molybdenum has a low coefficient of thermal expansion (i.e., about 4.8 $\mu m^{-1} \cdot K^{-1}$ at 25° C.), while having sufficient thermal conductivity (i.e., about 138 $W \cdot m^{-1} \cdot K^{-1}$ at 26.8° C.), allowing it to remain substantially the same shape upon heating while still providing thermal transfer to the attached substrate. Molybdenum also has a relatively high resistance to corrosion and wear. Thus, a molybdenum shield can be reused many times, including heating and cooling, to sputter layers in a commercial-scale manufacturing setting.

As used herein, the term "molybdenum shield" refers to shields including greater than about 75% by weight molybdenum. In some embodiments, the shield can include greater than about 95% by weight molybdenum, such as from about 97.5% to 100% by weight molybdenum (e.g., greater than about 99.5%). In particular embodiments, the shield can consist essentially of molybdenum (i.e., the shield is substantially free from other metals), and, in one particular embodiment, the shield can consist of molybdenum.

The methods are particular useful for deposition of a transparent conductive oxide ("TCO") layer on a glass superstrate during the manufacture of a thin film photovoltaic device (e.g., a thin film cadmium telluride based photovoltaic device). As such, the following description is directed to sputtering of the transparent conductive oxide layer, and optionally other subsequent thin film layers, in the manufacture of cadmium telluride based thin film photovoltaic devices. However, the presently disclosed methods may also be useful for the deposition of other thin films on other substrates, and is not intended to be limited by the following discussion.

The TCO layer allows light to pass through with minimal absorption while also allowing electric current produced by the device to travel sideways to opaque metal conductors. For instance, the TCO layer can have a sheet resistance less than about 30 ohm per square, such as from about 4 ohm per square to about 20 ohm per square (e.g., from about 8 ohm per square to about 15 ohm per square). The TCO layer generally includes at least one conductive oxide, such as tin oxide, zinc oxide, or indium tin oxide, or mixtures thereof. Additionally, the TCO layer can include other conductive, transparent materials. The TCO layer can also include zinc stannate and/or cadmium stannate. In certain embodiments, the TCO layer can have a thickness between about 0.1 μm and about 1 μm, for example from about 0.2 μm to about 0.8 μm, such as from about 0.3 μm to about 0.6 μm.

Figure 1:
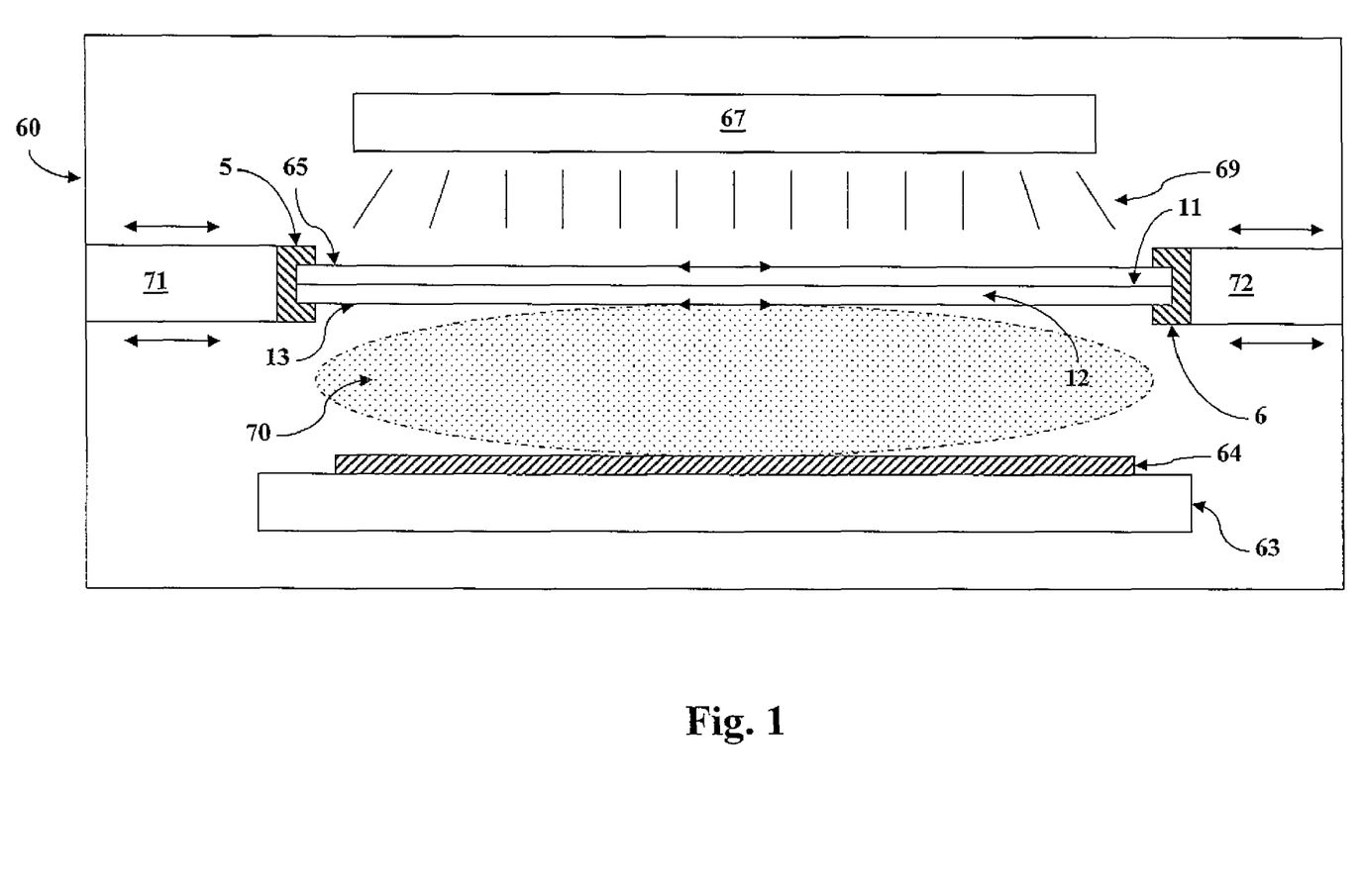
FIG. 1 shows a cross-sectional view of an exemplary sputtering chamber including a molybdenum shield attached to a substrate.
Figure 4:
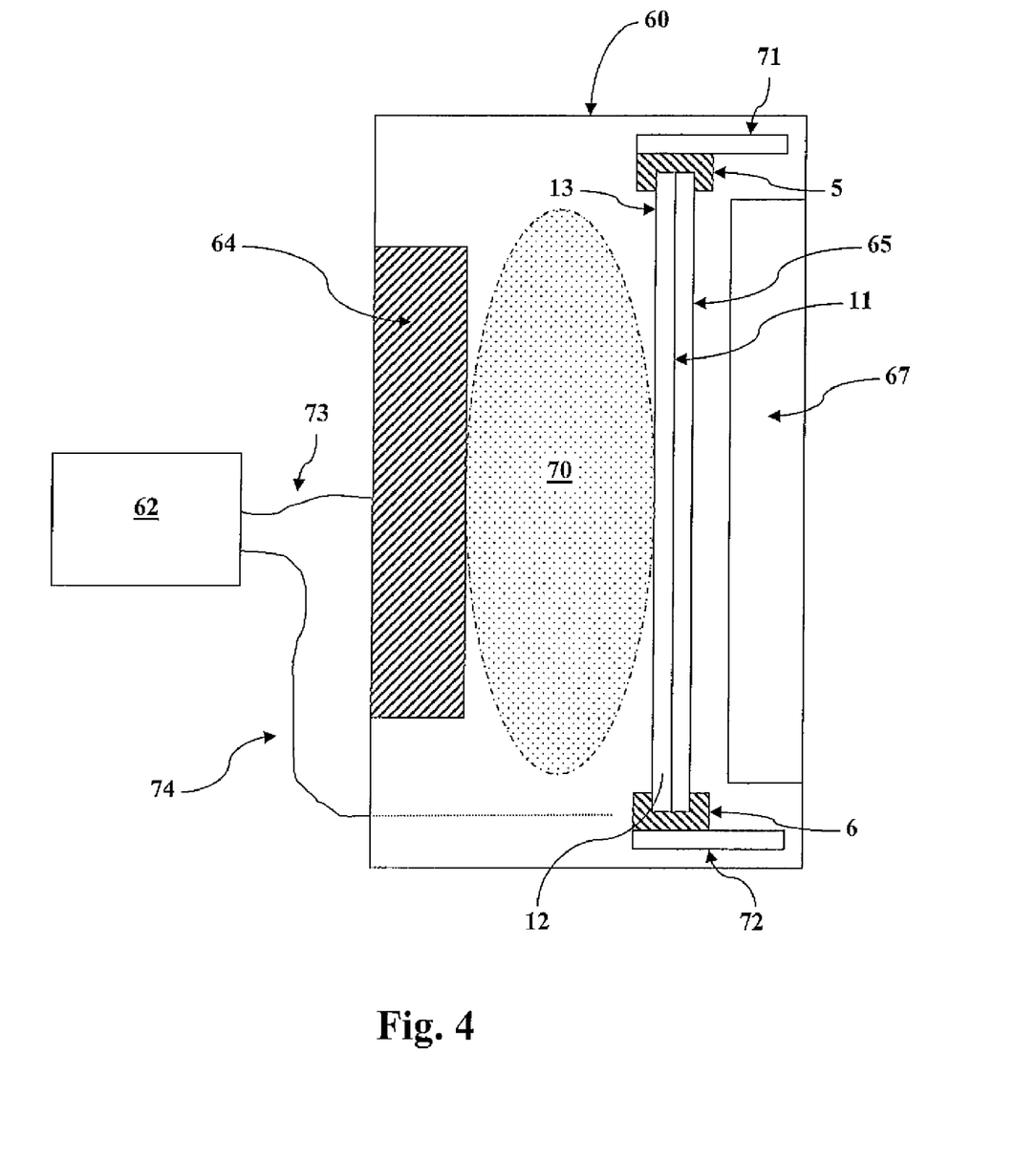
FIG. 4 shows a cross-sectional view of another exemplary sputtering chamber including a molybdenum shield attached to a substrate.

FIG. 1 and FIG. 4 show general schematics as a cross-sectional views of exemplary sputtering chambers 60 for use according to different embodiments of the presently disclosed methods. FIG. 1 generally shows an exemplary horizontal sputtering chamber 60 for "sputtering up" on the surface 13 of the substrate 12, while FIG. 4 shows an exemplary vertical sputtering chamber 60. However, the following description equally describes the shared elements of these different embodiments.

Generally, a first surface 11 of a substrate 12 is attached to a molybdenum shield 65. In the sputtering chamber 60, the substrate 12 and molybdenum shield 65 are positioned such that the molybdenum shield 65 is between an energy source 67 and the substrate 12. The energy source 67 provides thermal energy (represented by thermal rays 69) to heat the molybdenum shield 65. The molybdenum shield 65 can then heat the substrate 12 substantially uniformly via thermal exchange between the molybdenum shield 65 and the substrate 12 (i.e., thermal transfer from the molybdenum shield 65 to the substrate 12). Thus, the substrate 12 can be heated uniformly throughout the surface 11 resulting in a substantially uniform sputtering temperature on the surface 13 of the substrate opposite the molybdenum shield 65.

The energy source 67 can heat the molybdenum shield 65 until the substrate 12 is at the desired sputtering temperature. In one particular embodiment, the sputtering temperature of the substrate 12 can be greater than about 300° C., such as from about 350° C. to about 475° C., particularly from about 375° C. to about 425° C. The energy source 67 can be any suitable supply of thermal energy, including, but not limited to, a radiant heater, an induction heater, an electromagnetic radiation heater (e.g., an infrared heater), etc.

Thus, the TCO layer 14 can be uniformly sputtered at sputtering temperatures greater than about 300° C. In addition, and without wishing to be bound by any particular theory, it is believed that sputtering from a cadmium stannate target to form a CTO layer on the second surface 13 of the substrate 12 at these elevated temperatures (e.g., greater than about 300° C.) can result in CTO layer having a different crystal structure than the stoichiometric cadmium stannate ($Cd_2SnO_4$) normally formed via sputtering at room temperature. Instead, it is believed that a CTO layer sputtered at these elevated temperatures (e.g., greater than about 250° C.) results in a CTO layer including $CdSnO_3$ or some other fractional cadmium-containing crystalline structure.

FIG. 1 and FIG. 4 show the molybdenum shield 65 contacting substantially all of the surface area (i.e., about 100%) defined by the first surface 11 of the substrate 12. However, the molybdenum shield 65 need only contact a sufficient amount of the surface area of the first surface 11 to substantially uniformly heat the substrate 12 via thermal transfer from the molybdenum shield 65 to the substrate 12 (e.g., greater than about 75% of surface area of the first surface 11, such as from about 90% to about 99.9%). Additionally, the molybdenum shield 65 can protect the surface 11 of the substrate 12 by inhibiting deposition of any source material on the surface 11.

Figure 2:
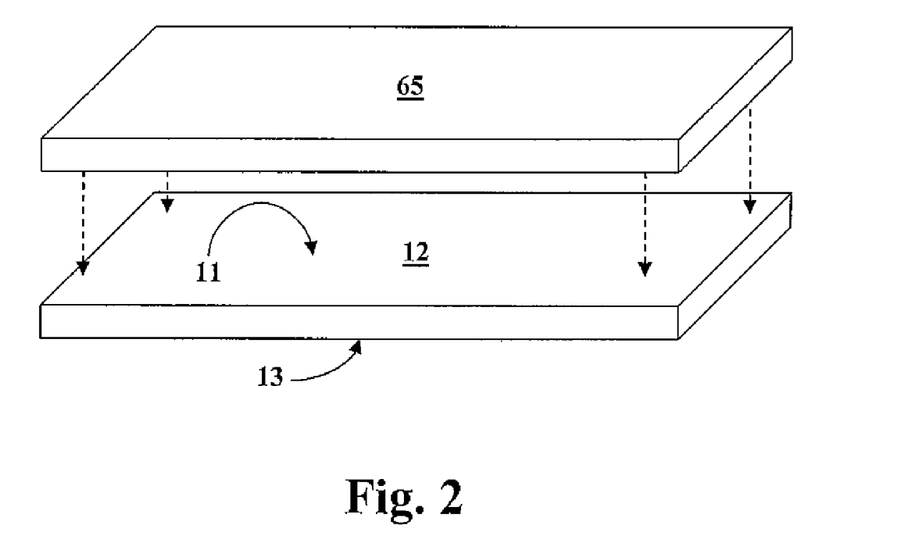
FIG. 2 shows a perspective view of positioning a molybdenum shield adjacent a surface of a substrate.

When manufacturing a rectangular photovoltaic device, the first surface 11 of the substrate 12 can define a rectangular plane, as shown in FIG. 2. In this embodiment, the molybdenum shield 65 can also define a rectangular plane, such that when attached to the first surface 11 of the substrate 12 substantially uniform thermal transfer from the molybdenum shield 65 to the substrate 12 is ensured. Similar dimensions defined by the substrate 12 and the molybdenum shield 65 can also allow for common edges to be defined and shared between the substrate 12 and the molybdenum shield 65. Thus, the substrate 12 can be clamped or otherwise fastened to the molybdenum shield 65 at these common edges.

Figure 3:
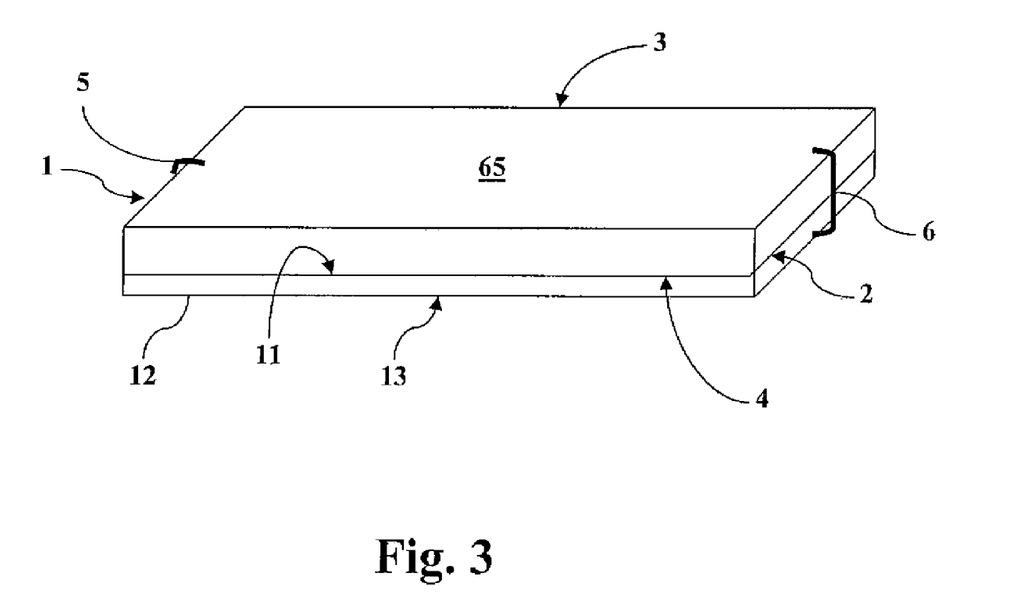
FIG. 3 shows a perspective view of attaching a molybdenum shield to a surface of a substrate.

For example, the molybdenum shield 65 can be attached to the first surface 11 of the substrate 12 via a first clamp 5 and a second clamp 6. FIG. 3 shows the first clamp 5 fastening a first common edge 1 shared and defined by the substrate 12 and the molybdenum shield 65, and the second clamp 6 fastening a second common edge 2 shared and defined by the substrate 12 and the molybdenum shield 65. Additional clamps may also be included to attach the first surface 11 of the substrate 12 to the molybdenum shield 65. For example, a third clamp (not shown) can be used to fasten a third common edge 3 shared and defined by the substrate 12 and the molybdenum shield 65, and a fourth clamp (not shown) can be used to fasten a fourth common edge 4 shared and defined by the substrate 12 and the molybdenum shield 65.

Figure 6:
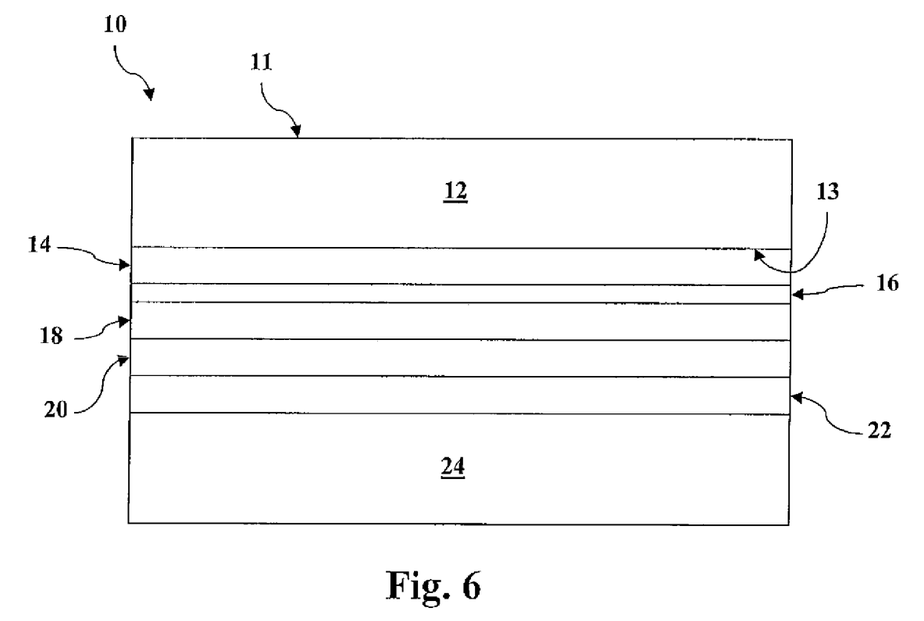
FIG. 6 shows a general schematic of a cross-sectional view of an exemplary cadmium telluride thin film photovoltaic device according to one embodiment of the present invention; and, FIG. 7 shows a flow diagram of an exemplary method of manufacturing a photovoltaic module including a cadmium telluride thin film photovoltaic device.

The substrate 12 is also positioned within the sputtering chamber 60 such that the second surface 13 is facing the target 64 in order to sputter a TCO layer onto the second surface 13 (e.g., the TCO layer 14 shown in the exemplary device 10 of FIG. 6). A plasma field 70 is created once the sputtering atmosphere is ignited, and is sustained in response to the voltage potential between the cathode 64 and the glass substrate 12 acting as an anode. The voltage potential causes the plasma ions within the plasma 70 to accelerate toward the target 64, causing atoms from the target 64 to be ejected toward the second surface 13 on the substrate 12. As such, the target 64 acts as the source material for the formation of the TCO layer 14.

In one particular embodiment, the target 64 can be a ceramic target of cadmium stannate ($Cd_2SnO_4$) to form a TCO layer 14 of cadmium stannate ("CTO") layer. Since a ceramic target 64 of cadmium stannate has low resistivity (e.g., less than about 0.5 ohms), the TCO layer 14 can be formed via DC sputtering by applying a direct current to the ceramic target 64 of cadmium stannate positioned near the substrate 12. Accordingly, the sputtering chamber 60 can have either an inert (e.g., an argon atmosphere), a reactive atmosphere (e.g., an oxygen atmosphere, nitrogen atmosphere, fluorine atmosphere), or a combination thereof that forms a plasma field 70 between the target 64 and the substrate 12. The pressure of the atmosphere can be between about 1 mTorr and about 20 mTorr for magnetron sputtering, or even higher for diode sputtering (e.g., from about 25 mTorr to about 100 mTorr). When the source material atoms are released from the target 64 upon application of the voltage, the source material atoms deposit onto the surface 13 of the substrate 12. For example, when the atmosphere contains oxygen, the atoms released from the metal target can form a oxide layer on the substrate. The current applied to the target 64 can vary depending on the size of the target 64, size of the sputtering chamber 60, amount of surface area of the second surface 13 of substrate 12, and other variables. In some embodiments, the current applied can be from about 2 amps to about 20 amps.

Alternatively, the TCO layer 14 of cadmium stannate layer can be formed via RF sputtering in an atmosphere of greater than about 80% by volume of an inert gas (e.g., argon), such as from about 85% to about 99% by volume. RF sputtering involves exciting a capacitive discharge by applying an alternating-current (AC) or radio-frequency (RF) signal between the target 64 (e.g., the ceramic source material) and the substrate 12. The sputtering atmosphere forming the plasma field 70 can have a pressure between about 1 mTorr and about 20 mTorr for magnetron sputtering, or even higher for diode sputtering (e.g., from about 25 mTorr to about 100 mTorr).

In either DC or RF sputtering described above, the atmosphere can be a purely inert atmosphere in some embodiments. For example, in one particular embodiment, a TCO layer 14 of cadmium stannate layer can be sputtered from a cadmium stannate target 64 in a pure argon atmosphere (e.g., about 100% by volume) having a pressure of from about 5 to about 10 mTorr. However, in other embodiments, the sputtering atmosphere can also include oxygen up to about 25% by volume, such as from about 1% to about 20% by volume.

Additionally, in some embodiments, a plurality of cathodes 64 can be utilized. A plurality of cathodes 64 can be particularly useful to form a layer including several types of materials (e.g., co-sputtering).

A pair of carriers, a first carrier 71 and a second carrier 72, can hold the substrate 12 and the molybdenum shield 65 in position in the sputtering chamber 60. In the embodiment shown in FIG. 1 and FIG. 4, the carriers 71, 72 can be attached to the first clamp 5 and the second clamp 6, respectively. In one particular embodiment, the carriers 71, 72 can move in unison to cause the substrate 12 and the molybdenum shield 65 to travel parallel to the surface of the target 64 (i.e., horizontally in the embodiment shown in FIG. 1 or in a direction perpendicular to the cross-section shown in FIG. 4). As such, the exposed surface 13 of the substrate 12 can cycle back and forth across the plasma field 70 during the sputtering process to allow for uniform deposition to form a substantially uniform layer in composition and thickness. The frequency of travel across the plasma field can vary according to the sputtering conditions. For example, the frequency of travel across the plasma field can be from about 1 pass per minute to about 10 passes per second, such as from about 10 passes per minute to about 1 pass per second.

FIG. 4 also shows a power source 62 configured to control and supply power (e.g., DC power, AC power, RF power, etc.) to the chamber 60. As shown, the power source 62 applies a voltage to the target 64 via a first wire 73 and a second wire 74 to create a voltage potential between the target 64 and the anode formed by the substrate 12. Although only a single power source 62 is shown, the voltage potential can be realized through the use of multiple power sources coupled together.

Figure 5:
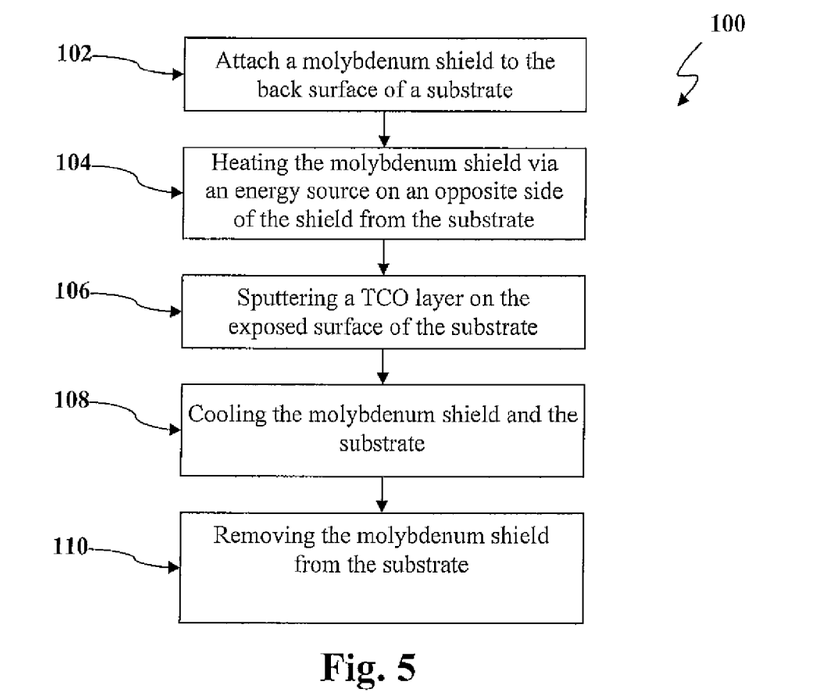
FIG. 5 shows a flow diagram of an exemplary method of sputtering a transparent conductive oxide layer on a substrate.

FIG. 5 shows a flow diagram of an exemplary method 100 of sputtering a conductive oxide layer on a substrate. According to the exemplary method 100, a molybdenum shield is attached to the back surface of a substrate at 102. The molybdenum shield is heated via an energy source positioned on an opposite side of the shield from the substrate at 104, which allows for thermal transfer from the molybdenum shield to heat the substrate to the sputtering temperature. At 106, a TCO layer is sputtered on the exposed surface of the substrate. At 108, the molybdenum shield and the substrate can be cooled, for instance to room temperature (e.g., from about 20° C. to about 25° C.), and the molybdenum shield can be removed from the substrate at 110.

One of ordinary skill in the art should recognize that other processing and/or treatments can be included in the method 100. For instance, the method 100 may also include subsequent processing, such as the method 30 described in FIG. 7, to form a photovoltaic device. Additionally, it should be recognized that the method 100 can be used to sputter layers other than the TCO layer (e.g., a resistive transparent buffer layer, a cadmium sulfide layer, etc.).

For example, the method of forming the TCO layer can be included in a method of manufacturing a cadmium telluride thin film photovoltaic device, such as disclosed in U.S. Publication No. 2009/0194165 of Murphy, et al. titled "Ultrahigh Current Density Cadmium Telluride Photovoltaic Modules."

FIG. 6 represents an exemplary cadmium telluride thin film photovoltaic device 10 including a top sheet of glass 12 employed as the substrate. In this embodiment, the glass 12 can be referred to as a "superstrate", as it is the substrate on which the subsequent layers are formed even though it faces upward to the radiation source (e.g., the sun) when the cadmium telluride thin film photovoltaic device 10 is in used. The top sheet of glass 12 can be a high-transmission glass (e.g., high transmission borosilicate glass), low-iron float glass, or other highly transparent glass material. The glass is generally thick enough to provide support for the subsequent film layers (e.g., from about 0.5 mm to about 10 mm thick), and is substantially flat to provide a good surface for forming the subsequent film layers. In one embodiment, the glass 12 can be a low iron float glass containing less than about 0.15% by weight iron (Fe), and may have a transmissiveness of about 0.9 or greater in the spectrum of interest (e.g., wavelengths from about 300 nm to about 900 nm).

The TCO layer 14 formed according to the discussion above is shown on the glass 12 of the exemplary device 10 of FIG. 1.

A resistive transparent buffer layer 16 (RTB layer) is shown on the TCO layer 14 on the exemplary cadmium telluride thin film photovoltaic device 10. The RTB layer 16 is generally more resistive than the TCO layer 14 and can help protect the device 10 from chemical interactions between the TCO layer 14 and the subsequent layers during processing of the device 10. For example, in certain embodiments, the RTB layer 16 can have a sheet resistance that is greater than about 1000 ohms per square, such as from about 10 kOhms per square to about 1000 MOhms per square. The RTB layer 16 can also have a wide optical bandgap (e.g., greater than about 2.5 eV, such as from about 2.7 eV to about 3.0 eV).

Without wishing to be bound by a particular theory, it is believed that the presence of the RTB layer 16 between the TCO layer 14 and the cadmium sulfide layer 18 can allow for a relatively thin cadmium sulfide layer 18 to be included in the device 10 by reducing the possibility of interface defects (i.e., "pinholes" in the cadmium sulfide layer 18) creating shunts between the TCO layer 14 and the cadmium telluride layer 22. Thus, it is believed that the RTB layer 16 allows for improved adhesion and/or interaction between the TCO layer 14 and the cadmium telluride layer 22, thereby allowing a relatively thin cadmium sulfide layer 18 to be formed thereon without significant adverse effects that would otherwise result from such a relatively thin cadmium sulfide layer 18 formed directly on the TCO layer 14.

The RTB layer 16 can include, for instance, a combination of zinc oxide (ZnO) and tin oxide ($SnO_2$), which can be referred to as a zinc/tin oxide layer ("ZTO"). In one particular embodiment, the RTB layer 16 can include more tin oxide than zinc oxide. For example, the RTB layer 16 can have a composition with a stoichiometric ratio of $ZnO/SnO_2$ between about 0.25 and about 3, such as in about an one to two (1:2) stoichiometric ratio of tin oxide to zinc oxide. The RTB layer 16 can be formed by sputtering, chemical vapor deposition, spraying pryolysis, or any other suitable deposition method.

In one particular embodiment, the RTB layer 16 can be formed by sputtering on the TCO layer 14 according to a method similar to the method described above with respect to sputtering the TCO layer 14 on the second surface 13 of the substrate 12. For example, the RTB layer 16 can be sputtered while the first surface 11 of the substrate 12 is still attached to the molybdenum shield 65 before removing the molybdenum shield 65 from the substrate 12.

In certain embodiments, the RTB layer 16 can have a thickness between about 0.075 μm and about 1 μm, for example from about 0.1 μm to about 0.5 μm. In particular embodiments, the RTB layer 16 can have a thickness between about 0.08 μm and about 0.2 μm, for example from about 0.1 μm to about 0.15 μm.

A cadmium sulfide layer 18 is shown on resistive transparent buffer layer 16 of the exemplary device 10 of FIG. 6. The cadmium sulfide layer 18 is a n-type layer that generally includes cadmium sulfide (CdS) but may also include other materials, such as zinc sulfide, cadmium zinc sulfide, etc., and mixtures thereof as well as dopants and other impurities. In one particular embodiment, the cadmium sulfide layer may include oxygen up to about 25% by atomic percentage, for example from about 5% to about 20% by atomic percentage. The cadmium sulfide layer 18 can have a wide band gap (e.g., from about 2.25 eV to about 2.5 eV, such as about 2.4 eV) in order to allow most radiation energy (e.g., solar radiation) to pass. As such, the cadmium sulfide layer 18 is considered a transparent layer on the device 10.

The cadmium sulfide layer 18 can be formed by sputtering, chemical vapor deposition, chemical bath deposition, and other suitable deposition methods. In one particular embodiment, the cadmium sulfide layer 18 can be formed by sputtering (e.g., direct current (DC) sputtering or radio frequency (RF) sputtering) on the resistive transparent buffer layer 16. For example, the cadmium sulfide layer 18 can be formed by sputtering on the RTB layer 16 according to a method similar to the method described above with respect to sputtering the TCO layer 14 on the second surface 13 of the substrate 12. For example, the cadmium sulfide layer 18 can be sputtered while the first surface 11 of the substrate 12 is still attached to the molybdenum shield 65 before removing the molybdenum shield 65 from the substrate 12.

Due to the presence of the resistive transparent buffer layer 16, the cadmium sulfide layer 18 can have a thickness that is less than about 0.1 µm, such as between about 10 nm and about 100 nm, such as from about 50 nm to about 80 nm, with a minimal presence of pinholes between the resistive transparent buffer layer 16 and the cadmium sulfide layer 18. Additionally, a cadmium sulfide layer 18 having a thickness less than about 0.1 µm reduces any absorption of radiation energy by the cadmium sulfide layer 18, effectively increasing the amount of radiation energy reaching the underlying cadmium telluride layer 22.

A cadmium telluride layer 20 is shown on the cadmium sulfide layer 18 in the exemplary cadmium telluride thin film photovoltaic device 10 of FIG. 6. The cadmium telluride layer 20 is a p-type layer that generally includes cadmium telluride (CdS) but may also include other materials. As the p-type layer of device 10, the cadmium telluride layer 20 is the photovoltaic layer that interacts with the cadmium sulfide layer 18 (i.e., the n-type layer) to produce current from the absorption of radiation energy by absorbing the majority of the radiation energy passing into the device 10 due to its high absorption coefficient and creating electron-hole pairs. For example, the cadmium telluride layer 20 can generally be formed from cadmium telluride and can have a bandgap tailored to absorb radiation energy (e.g., from about 1.4 eV to about 1.5 eV, such as about 1.45 eV) to create electron-hole pairs upon absorption of the radiation energy. Holes may travel from the p-type side (i.e., the cadmium telluride layer 20) across the junction to the n-type side (i.e., the cadmium sulfide layer 18) and, conversely, electrons may pass from the n-type side to the p-type side. Thus, the p-n junction formed between the cadmium sulfide layer 18 and the cadmium telluride layer 20 forms a diode-like material that allows conventional current to flow in only one direction to create a charge imbalance across the boundary. This charge imbalance leads to the creation of an electric field spanning the p-n junction and separating the freed electrons and holes.

The cadmium telluride layer 20 can be formed by any known process, such as chemical vapor deposition (CVD), spray pyrolysis, electro-deposition, sputtering, close-space sublimation (CSS), etc. In one particular embodiment, the cadmium sulfide layer 18 is deposited by a sputtering and the cadmium telluride layer 20 is deposited by close-space sublimation. In particular embodiments, the cadmium telluride layer 20 can have a thickness between about 0.1 µm and about 10 µm, such as from about 1 µm and about 5 µm. In one particular embodiment, the cadmium telluride layer 20 can have a thickness between about 2 µm and about 4 µm, such as about 3 µm.

A series of post-forming treatments can be applied to the exposed surface of the cadmium telluride layer 20. These treatments can tailor the functionality of the cadmium telluride layer 20 and prepare its surface for subsequent adhesion to the back contact layer(s) 22. For example, the cadmium telluride layer 20 can be annealed at elevated temperatures (e.g., from about 350° C. to about 500° C., such as from about 375° C. to about 424° C.) for a sufficient time (e.g., from about 1 to about 10 minutes) to create a quality p-type layer of cadmium telluride. Without wishing to be bound by theory, it is believed that annealing the cadmium telluride layer 20 (and the device 10) converts the normally n-type cadmium telluride layer 20 to a p-type cadmium telluride layer 20 having a relatively low resistivity. Additionally, the cadmium telluride layer 20 can recrystallize and undergo grain growth during annealing.

Annealing the cadmium telluride layer 20 can be carried out in the presence of cadmium chloride in order to dope the cadmium telluride layer 20 with chloride ions. For example, the cadmium telluride layer 20 can be washed with an aqueous solution containing cadmium chloride and then annealed at the elevated temperature.

In one particular embodiment, after annealing the cadmium telluride layer 20 in the presence of cadmium chloride, the surface can be washed to remove any cadmium oxide formed on the surface. This surface preparation can leave a Te-rich surface on the cadmium telluride layer 20 by removing cadmium oxide from the surface. For instance, the surface can be washed with a suitable solvent (e.g., ethylenediamine also known as 1,2 diaminoethane or "DAE") to remove any cadmium oxide from the surface.

Additionally, copper can be added to the cadmium telluride layer 20. Along with a suitable etch, the addition of copper to the cadmium telluride layer 20 can form a surface of copper-telluride on the cadmium telluride layer 20 in order to obtain a low-resistance electrical contact between the cadmium telluride layer 20 (i.e., the p-type layer) and the back contact layer(s). Specifically, the addition of copper can create a surface layer of cuprous telluride ($Cu_2Te$) between the cadmium telluride layer 20 and the back contact layer 22. Thus, the Te-rich surface of the cadmium telluride layer 20 can enhance the collection of current created by the device through lower resistivity between the cadmium telluride layer 20 and the back contact layer 24.

Copper can be applied to the exposed surface of the cadmium telluride layer 20 by any process. For example, copper can be sprayed or washed on the surface of the cadmium telluride layer 20 in a solution with a suitable solvent (e.g., methanol, water, acetate, or the like, or combinations thereof) followed by annealing. In particular embodiments, the copper may be supplied in the solution in the form of copper chloride. The annealing temperature is sufficient to allow diffusion of the copper ions into the cadmium telluride layer 20, such as from about 125° C. to about 300° C. (e.g. from about 150° C. to about 200° C.) for about 5 minutes to about 30 minutes, such as from about 10 to about 25 minutes.

A back contact layer 22 is shown on the cadmium telluride layer 20. The back contact layer 22 generally serves as the back electrical contact, in relation to the opposite, TCO layer 14 serving as the front electrical contact. The back contact layer 22 can be formed on, and in one embodiment is in direct contact with, the cadmium telluride layer 20. The back contact layer 22 is suitably made from one or more highly conductive materials, such as elemental nickel, chromium, copper, tin, aluminum, gold, silver, technetium or alloys or mixtures thereof. Additionally, the back contact layer 22 can be a single layer or can be a plurality of layers. In one particular embodiment, the back contact layer 22 can include graphite, such as a layer of carbon deposited on the p-layer followed by one or more layers of metal, such as the metals described above. The back contact layer 22, if made of or comprising one or more metals, is suitably applied by a technique such as sputtering or metal evaporation. If it is made from a graphite and polymer blend, or from a carbon paste, the blend or paste is applied to the semiconductor device by any suitable method for spreading the blend or paste, such as screen printing, spraying or by a "doctor" blade. After the application of the graphite blend or carbon paste, the device can be heated to convert the blend or paste into the conductive back contact layer. A carbon layer, if used, can be from about 0.1 µm to about 10 µm in thickness, for example from about 1 µm to about 5 µm. A metal layer of the back contact, if used for or as part of the back contact layer 22, can be from about 0.1 µm to about 1 µm in thickness.

The encapsulating glass 24 is also shown in the exemplary cadmium telluride thin film photovoltaic device 10 of FIG. 6.

Other components (not shown) can be included in the exemplary device 10, such as bus bars, external wiring, laser etches, etc. For example, when the device 10 forms a photovoltaic cell of a photovoltaic module, a plurality of photovoltaic cells can be connected in series in order to achieve a desired voltage, such as through an electrical wiring connection. Each end of the series connected cells can be attached to a suitable conductor such as a wire or bus bar, to direct the photovoltaically generated current to convenient locations for connection to a device or other system using the generated electric. A convenient means for achieving such series connections is to laser scribe the device to divide the device into a series of cells connected by interconnects. In one particular embodiment, for instance, a laser can be used to scribe the deposited layers of the semiconductor device to divide the device into a plurality of series connected cells.

Figure 7:
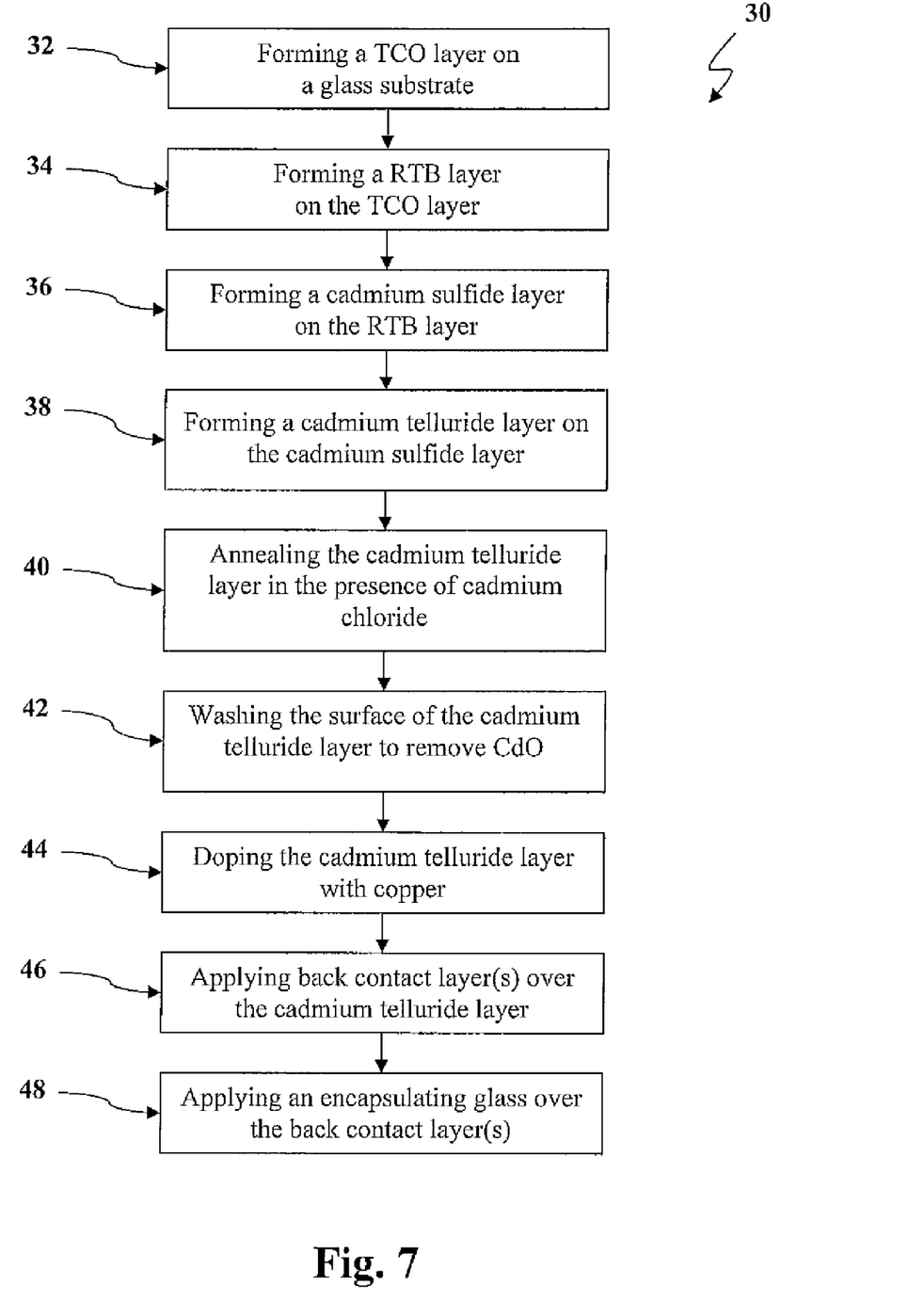

FIG. 7 shows a flow diagram of an exemplary method 30 of manufacturing a photovoltaic device according to one embodiment of the present invention, According to the exemplary method 30, a TCO layer is formed on a glass substrate at 32. At 34, a resistive transparent buffer layer is formed on the TCO layer. A cadmium sulfide layer is formed on the resistive transparent buffer layer at 36, and a cadmium telluride layer is formed on the cadmium sulfide layer at 38. The cadmium telluride layer can be annealed in the presence of cadmium chloride at 40, and washed at 42 to remove any CdO formed on the surface. The cadmium telluride layer can be doped with copper at 44. At 46, back contact layer(s) can be applied over the cadmium telluride layer, and an encapsulating glass can be applied over the back contact layer at 48.

One of ordinary skill in the art should recognize that other processing and/or treatments can be included in the method 30. For instance, the method may also include laser scribing to form electrically isolated photovoltaic cells in the device. These electrically isolated photovoltaic cells can then be connected in series to form a photovoltaic module. Also, electrical wires can be connected to positive and negative terminals of the photovoltaic module to provide lead wires to harness electrical current produced by the photovoltaic module.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of depositing a transparent conductive oxide layer on a substrate defining a first surface and a second surface, the method comprising:

Attaching a pair of clamps to secure a shield to the first surface of the substrate such that the shield contacts at least about 75% of the first surface, wherein the shield comprises greater than about 75% by weight molybdenum;

heating the shield via an energy source, wherein thermal transfer from the shield to the substrate heats the substrate to a sputtering temperature; and, sputtering a transparent conductive oxide layer on the second surface of the substrate from a target at the sputtering temperature, wherein a pair of carriers attached to the pair of clamps move the substrate and the shield together in unison to cause the second surface of the substrate to travel parallel to the target.

2. The method as in claim 1, wherein the shield comprises greater than about 95% by weight molybdenum.

3. The method as in claim 1, wherein the shield consists essentially of molybdenum.

4. The method as in claim 1, wherein the shield consists of molybdenum.

5. The method as in claim 1, wherein the sputtering temperature is at least about 300° C.

6. The method as in claim 5, wherein the sputtering temperature is between about 350° C. and about 475° C.

7. The method of claim 5, further comprising:

cooling the substrate to between about 20° C. to about 25° C. after sputtering the transparent conductive oxide layer at the sputtering temperature; and, removing the shield from the first surface of the substrate.

8. The method as in claim 1 further comprising:

sputtering a resistive transparent buffer layer on the transparent conductive oxide layer;

thereafter, cooling the substrate to between about 20° C. to about 25° C.; and, removing the shield from the first surface of the substrate.

9. The method as in claim 1 further comprising:

sputtering a resistive transparent buffer layer on the transparent conductive oxide layer;

sputtering a cadmium sulfide layer on the resistive transparent buffer layer;

thereafter, cooling the substrate to between about 20° C. to about 25° C.; and, removing the shield from the first surface of the substrate.

10. The method as in claim 1, wherein energy source comprises a radiant heater.

11. The method as in claim 1, wherein the shield and the substrate have a similar shape such that the shield and the substrate define a first common edge and a second common edge, and wherein the shield is attached to the first surface of the substrate via a first clamp about the first common edge and a second clamp about the second common edge.

12. The method as in claim 1, wherein the shield contacts at least about 95% of the first surface.

13. The method as in claim 12, wherein the shield and the substrate are rectangularly shaped with substantially identical dimensions such that the shield and the substrate define a first common edge, a second common edge, a third common edge, and a fourth common edge such that the first common edge is opposite the second common edge and the third common edge is opposite the fourth common edge, and wherein the shield is attached to the first surface of the substrate via a first clamp about the first common edge and a second clamp about the second common edge.

14. The method as in claim 1, wherein the pair of carriers cycle the substrate and the shield in unison back and forth across the target during sputtering.

15. The method as in claim 1, wherein the transparent conductive oxide layer is sputtered from a ceramic cadmium stannate target in an atmosphere comprising argon such that the transparent conductive oxide layer comprises cadmium stannate.

16. The method as in claim 15, wherein the atmosphere further comprises oxygen up to about 20% by volume.

17. A method for manufacturing a cadmium telluride based thin film photovoltaic device, the method comprising:
   attaching a pair of claims to secure a shield to a first surface of a glass superstrate such that the shield contacts at least about 75% of the first surface, wherein the shield comprises greater than about 95% by weight molybdenum;
   heating the shield via an energy source, wherein thermal transfer from the shield to the substrate heats the glass superstrate to a sputtering temperature;
   sputtering a transparent conductive oxide layer on the second surface of the glass superstrate at the sputtering temperature, wherein a pair of carriers attached to the pair of clamps move the substrate and the shield together in unison to cause the second surface of the substrate to travel parallel to the target;
   sputtering a resistive transparent buffer layer on the transparent conductive oxide layer; forming a cadmium sulfide layer on the resistive transparent buffer layer; forming a cadmium telluride layer on the cadmium sulfide layer; and, forming a back contact layer on the cadmium telluride layer.

18. The method as in claim 17, further comprising:
   removing the shield from the first surface of the glass superstrate after sputtering the transparent conductive oxide layer, sputtering a resistive transparent buffer layer, or forming a cadmium sulfide layer.

* * * * *